United States Patent
Nguyen et al.

(10) Patent No.: US 9,618,541 B1
(45) Date of Patent: Apr. 11, 2017

(54) APPARATUS, METHOD AND DEVICE FOR SENSING DC CURRENTS

(71) Applicant: Neilsen-Kuljian, Inc., San Jose, CA (US)

(72) Inventors: Huy D. Nguyen, Tracy, CA (US); Tom Lik-Chung Lee, San Jose, CA (US)

(73) Assignee: NEILSEN-KULJIAN, INC., San Jose, CA (US)

( * ) Notice: Subject to any disclaimer, the term of this patent is extended or adjusted under 35 U.S.C. 154(b) by 0 days.

(21) Appl. No.: 15/134,328

(22) Filed: Apr. 20, 2016

(51) Int. Cl.
  G01R 15/18 (2006.01)
  G01R 15/20 (2006.01)
  G01R 19/20 (2006.01)
  G01R 15/14 (2006.01)

(52) U.S. Cl.
  CPC ......... *G01R 15/148* (2013.01); *G01R 15/183* (2013.01)

(58) Field of Classification Search
  CPC .............................. G01R 15/148; G01R 15/183
  USPC ........................................................ 324/117 R
  See application file for complete search history.

(56) References Cited

U.S. PATENT DOCUMENTS

| | | | | |
|---|---|---|---|---|
| 3,157,836 A | * | 11/1964 | Jarvinen | H03F 9/02 323/335 |
| 3,218,547 A | * | 11/1965 | Ling | G01R 33/045 324/254 |
| 3,660,749 A | * | 5/1972 | Kadri | H02M 3/3388 331/113 A |
| 3,701,007 A | * | 10/1972 | Schad | G01R 33/04 324/247 |
| 3,731,752 A | * | 5/1973 | Schad | E21B 7/04 175/45 |
| 3,768,011 A | * | 10/1973 | Swain | G01R 33/04 324/117 R |
| 4,266,190 A | * | 5/1981 | Lipman | H03F 9/00 324/117 R |
| 4,274,051 A | * | 6/1981 | Condon | G01R 19/20 324/117 R |

(Continued)

FOREIGN PATENT DOCUMENTS

JP   59124114 A   *   7/1984

OTHER PUBLICATIONS

Cheng et al., A Novel Current Sensor Based on Dual Hall Chips, 2012 International Conference on Electronic Packaging Technology & High Density Packaging. 2012 IEEE.*

(Continued)

*Primary Examiner* — Patrick Assouad
*Assistant Examiner* — Sean Curtis
(74) *Attorney, Agent, or Firm* — TIPS Group

(57) ABSTRACT

A magnetometer that senses low level currents flowing in a conductor or wire includes two cores with excitation windings on each core that are connected in series but which are wound in opposite orientations. A periodic alternating current drives the windings. Since the windings are in series but oppositely wound, the current flowing through the windings will produce equal but opposite flux flows in the two cores. A sensing winding is wound around both cores to provide flux profiles. A digital processor analyzes a quiescent flux profile, which is generated when no sense current is flowing through the dual cores, and distorted flux profiles when sense currents are flowing through the dual cores to measure a sense current flowing through the dual cores.

19 Claims, 12 Drawing Sheets

(56) References Cited

U.S. PATENT DOCUMENTS

| | | | | |
|---|---|---|---|---|
| 4,277,751 A * | 7/1981 | Lawson | G01R 33/045 | 324/247 |
| 4,278,939 A * | 7/1981 | Henry | G01R 33/045 | 324/117 R |
| 4,280,093 A * | 7/1981 | Houston | G01R 19/175 | 324/117 R |
| 4,347,469 A * | 8/1982 | Dinger | G01R 15/185 | 318/512 |
| 4,371,832 A * | 2/1983 | Wilson | H02H 3/332 | 324/117 R |
| 4,378,525 A * | 3/1983 | Burdick | G01R 1/22 | 324/117 R |
| 4,454,553 A * | 6/1984 | Iwasaki | G01R 19/15 | 324/117 R |
| 4,516,070 A * | 5/1985 | Brown | G01R 15/185 | 324/117 R |
| 4,536,706 A * | 8/1985 | Kemper | G01R 15/185 | 324/117 R |
| 4,616,174 A * | 10/1986 | Jorgensen | G01R 19/20 | 324/117 R |
| 4,626,777 A * | 12/1986 | Ainsworth | G01R 19/14 | 324/117 R |
| 4,742,294 A * | 5/1988 | Gallios | H01F 27/427 | 315/3.5 |
| 4,914,381 A * | 4/1990 | Narod | G01R 15/185 | 324/117 R |
| 4,929,899 A * | 5/1990 | Weixelman | G01R 33/04 | 324/224 |
| 5,015,945 A * | 5/1991 | Radun | G01R 15/181 | 324/117 R |
| 5,329,269 A * | 7/1994 | Watson | G01R 33/0206 | 29/609 |
| 5,341,102 A * | 8/1994 | Akiyama | G01R 27/22 | 324/202 |
| 5,767,667 A * | 6/1998 | Shafie | G01R 19/20 | 324/117 R |
| 6,018,238 A * | 1/2000 | Shafie | G01R 15/186 | 324/117 R |
| 6,150,896 A * | 11/2000 | DeCramer | H04N 7/108 | 333/25 |
| 6,278,272 B1 * | 8/2001 | Scarzello | G01R 33/045 | 324/253 |
| 6,414,493 B1 * | 7/2002 | Rezvani | G01N 27/023 | 324/442 |
| 6,417,665 B1 * | 7/2002 | Scarzello | G01R 33/045 | 324/253 |
| 6,734,659 B1 * | 5/2004 | Fortner | G01L 9/12 | 324/117 R |
| 6,998,840 B2 * | 2/2006 | Choi | G01R 33/04 | 324/253 |
| 7,071,678 B2 * | 7/2006 | Karlsson | G01R 15/185 | 324/117 R |
| 7,123,005 B2 * | 10/2006 | Leger | G01R 33/045 | 324/225 |
| 7,145,321 B2 * | 12/2006 | Sandquist | G01R 15/185 | 324/117 R |
| 7,298,141 B2 * | 11/2007 | Bartington | G01R 33/04 | 324/253 |
| 7,355,397 B2 * | 4/2008 | Cripe | G01R 33/04 | 324/253 |
| 7,372,261 B2 * | 5/2008 | Choi | G01R 33/04 | 324/249 |
| 7,378,843 B2 * | 5/2008 | Beranger | G01R 33/04 | 324/244 |
| 7,388,363 B2 * | 6/2008 | Jorgensen | G01R 15/185 | 324/117 R |
| 7,407,596 B2 * | 8/2008 | Choi | G01R 33/04 | 216/17 |
| 7,557,571 B2 * | 7/2009 | Choi | G01R 33/05 | 324/249 |
| 8,456,178 B2 * | 6/2013 | Wang | G01N 27/023 | 324/654 |
| 8,473,232 B2 * | 6/2013 | Imaizumi | G01R 27/02 | 324/713 |
| 8,552,750 B2 * | 10/2013 | Fougere | G01N 27/02 | 324/639 |
| 8,669,763 B2 * | 3/2014 | Takatsuji | G01R 33/0023 | 324/225 |
| 8,698,426 B1 * | 4/2014 | Nguyen | H02H 1/06 | 315/177 |
| 9,041,390 B1 * | 5/2015 | Nguyen | G01R 33/0023 | 324/251 |
| 9,118,289 B1 * | 8/2015 | Fraley | H03F 9/00 | |
| 9,410,910 B1 * | 8/2016 | Fougere | G01N 27/06 | |
| 2003/0173961 A1 * | 9/2003 | Choi | G01R 33/04 | 324/253 |
| 2003/0173963 A1 * | 9/2003 | Choi | G01R 33/05 | 324/253 |
| 2004/0027121 A1 * | 2/2004 | Choi | G01R 33/04 | 324/253 |
| 2004/0196035 A1 * | 10/2004 | Leger | G01R 33/045 | 324/253 |
| 2005/0001706 A1 * | 1/2005 | Ingemar Karlsson | G01R 15/185 | 336/182 |
| 2005/0035761 A1 * | 2/2005 | Park | G01R 33/05 | 324/244 |
| 2005/0172480 A1 * | 8/2005 | Choi | G01R 33/04 | 29/607 |
| 2006/0192548 A1 * | 8/2006 | Sandquist | G01R 15/185 | 324/117 R |
| 2006/0192549 A1 * | 8/2006 | Sandquist | G01R 15/183 | 324/117 R |
| 2006/0192550 A1 * | 8/2006 | Sandquist | G01R 15/183 | 324/117 R |
| 2007/0145968 A1 * | 6/2007 | Jorgensen | G01R 15/185 | 324/127 |
| 2011/0140717 A1 * | 6/2011 | Wang | G01N 27/023 | 324/654 |
| 2011/0184680 A1 * | 7/2011 | Imaizumi | G01R 27/02 | 702/65 |
| 2011/0241665 A1 * | 10/2011 | Takatsuji | G01R 33/0023 | 324/253 |
| 2014/0009143 A1 * | 1/2014 | Blagojevic | G01R 33/04 | 324/244 |
| 2014/0009146 A1 * | 1/2014 | Blagojevic | G01R 33/04 | 324/252 |
| 2015/0107874 A1 * | 4/2015 | Green | H01B 9/006 | 174/114 R |
| 2015/0108967 A1 * | 4/2015 | Barczyk | G01R 15/185 | 324/202 |
| 2015/0108974 A1 * | 4/2015 | Kennedy | G01R 33/09 | 324/252 |
| 2015/0160271 A1 * | 6/2015 | Yoshida | G01R 15/185 | 324/117 R |
| 2015/0219692 A1 * | 8/2015 | Krah | G01R 33/0017 | 324/117 H |
| 2015/0233977 A1 * | 8/2015 | Platise | G01R 19/0092 | 324/117 R |
| 2015/0268280 A1 * | 9/2015 | Miljanic | G01R 15/185 | 324/127 |

OTHER PUBLICATIONS

Zhang et al., A New Complementary Symmetrical Structure of using Dual Magnetic Cores for open loop Hall Effect current sensors, PCIM Europe May 2015.*

Vourc'H et al., Neel Effect Toroidal Current Sensor, IEEE Transactions on Magnetics, 2013.*

Malatek et al., Double Core GMI current sensor, IEEE Transactions on Magnetics, Nov. 2005.*

* cited by examiner

APPARATUS, METHOD AND DEVICE FOR SENSING DC CURRENTS

BACKGROUND

Direct current (DC) power systems are becoming increasingly common. For example, DC power systems are being used in solar panel farms, rail systems, and telecommunication systems. To safely and efficiently monitor the operation of a DC power system it is important to sense the DC current that it develops. In some cases, ground-fault current detection is also needed to protect equipment and personnel. The requirement for detecting DC current levels involved in ground faults are normally in the low, milliampere range.

A magnetometer can be used to measure DC current flow without directly contacting the conductor through which it is flowing by sensing the magnetic field around the conductor generated by the current flow. A magnetometer relies upon Ampere's law, which holds that the integral of the magnetic field B tangential to an electrically conductive closed path is proportional to the net current enclosed by the area surrounding the path. Hence, sensing the magnetic field of a circular closed path that encloses a conductor will provide the necessary information to calculate the net current flowing through the conductor.

Prior art magnetometers typically use either Hall Effect sensors or fluxgate sensors. A Hall Effect sensor is a direct magnetic field strength sensor that, based upon current technology, has an effective sensitivity down to approximately 0.5 amperes (A), and thus is not suited for sensing current in the milliampere (mA) range. A fluxgate sensor is based on Faraday's law of induction to sense the flux change ($-d\phi/dt$) disturbance by a "sense current", e.g. a current flowing through a conductor. One type of fluxgate sensor uses a single core, which has the disadvantage of being sensitive to earth magnetic field bias if the windings are distributed unevenly (resulting in an inconsistent bias being applied to the circuit when the core is oriented in different attitudes) or capacitive coupling between the windings, if they are distributed evenly, which can be injected into the sensing signal. While more complicated and expensive, a dual core configuration can mitigate the aforementioned shortcomings of the single core configuration.

U.S. Pat. No. 7,378,843 describes a magnetic field measuring device, equipped with a fluxgate magnetometer, having at least one magnetic core and a plurality of windings, and configured to deliver at least one output signal and pulse generating means for emitting at least one excitation signal at the input of the magnetic sensor, in the form of a succession of excitation pulses. U.S. Pat. No. 7,355,397 describes a fluxgate magnetometer drive circuit includes a fluxgate inductor that is driven through magnetic saturation by altering voltage pulses. U.S. Pat. No. 4,929,899 describes a fluxgate magnetometer having wide temperature range accuracy that aligns a permeable magnetic tape core relative to a secondary winding and increasing a fluxgate magnetometer primary drive current above what is normally considered saturation current to reduce sensitivity of the output to temperature and primary drive changes.

Fluxgate technology is advantageous in that it can be used to measure currents down to the mA range. However, prior art fluxgate magnetometers, whether they are single or dual core types, consume considerably more power than Hall Effect magnetometers due to the need to drive the magnetic core(s) into magnetic flux saturation by the continuous application of an alternating current (AC) into the core windings.

These and other limitations of the prior art will become apparent to those of skill in the art upon a reading of the following descriptions and a study of the several figures of the drawing.

SUMMARY

Disadvantages of the prior art are addressed by a magnetometer that senses low level currents with two cores provided with excitation windings on each core which are wound in opposite orientations and connected in series. A periodic alternating current drives the windings. Since the windings are in series but oppositely wound, the current flowing through the windings will produce equal but opposite flux flows in the two cores. A sensing winding is wound around both cores to provide flux profiles. A digital processor analyzes a quiescent flux profile, which is generated when no sense current is flowing through the dual cores, and distorted flux profiles when sense currents are flowing through the dual cores.

An apparatus for sensing D.C. currents, set forth by way of example and not limitation, includes a dual core toroid having a first core at least partially wound with a first insulated wire, a second core at least partially wound with a second insulated wire, and a third insulated wire wound at least partially around a combination of the first core and the second core, wherein the first insulated wire and the second insulated wire are connected in series such that magnetic fluxes in the first core and the second core flow in opposite directions; a coil motor driver developing rectangular pulses coupled to the series connection of the first insulated wire and the second insulated wire; a signal amplifier having an input coupled to the third insulated wire and operative to develop an analog flux profile signal; an analog-to-digital (A/D) converter coupled to an output of the signal amplifier and operative to develop a digital flux profile signal; and a digital processor coupled to the A/D converter to calculate a sense current flow from variations between a quiescent digital flux profile and a distorted digital flux profile.

A method for sensing D.C. currents, set forth by way of example and not limitation, includes: (a) detecting an analog quiescent flux profile from an output of a dual core toroid when no sense current is flowing thorough the dual core toroid; (b) digitizing the analog quiescent flux profile to create a digital quiescent flux profile; (c) storing the digital quiescent flux profile in non-transitory computer readable media; (d) detecting a distorted flux profile from the output of the dual core toroid when a sense current is flowing through the dual core toroid; (e) digitizing the distorted flux profile to create a digital distorted flux profile; and (f) using a digital processor to determine at least one characteristic of the sense current from a comparison between the stored digital quiescent flux profile and the distorted flux profile.

A device for sensing D.C. currents, set forth by way of example and not limitation, includes a first magnetically permeable annular core defining a first circumference, a first central axis and a first central plane perpendicular to the first central axis; a second magnetically permeable annular core defining a second circumference, a second central axis and a second central plane perpendicular to the second central axis, wherein the first magnetically permeable annular core and the second magnetically permeable annular core are aligned such that the first central axis and the second central axis are substantially coaxial, the first central plane and the second central plane are substantially parallel and the first circumference and the second circumference define a combined circumference; a first insulated wire coil wound in a first direction at least partially around the first circumference of the first magnetically permeable annular core; a second insulated wire coil wound in a second direction at least partially around the second circumference of the second magnetically permeable annular core, where the first insulated wire coil and the second insulated wire coil are connected in series, have the same number of turns, and configured such that a magnetic flux flows in the first magnetically permeable annular core in a first direction and that a magnetic flux flows in the second magnetically permeable annular core is in a second direction opposite to the first direction when a current is caused to flow through the series connection of the first insulated wire coil and the second insulated wire coil; and a third insulated wire coil wound at least partially around the combined circumference of the first magnetically permeable annular core and the second magnetically permeable annular core. In another example embodiment, a fourth insulated wire coil is also wound at least partially around the combined circumference of the first magnetically permeable annular core and the second magnetically permeable annular core.

An advantage of example embodiments is that they do not require driving the cores into full saturation as required by the prior art fluxgate apparatus. This results in improved sensitivity and reduced power consumption compared to prior art fluxgate magnetometers.

Another advantage of example embodiments is that a fourth winding can be utilized to drive a controlled current commanded by the digital signal processor through the core to cancel the sense current in such a way that the precise amplitude of the sense current through the core can be analyzed. The forth winding can also be used to degauss the dual cores, should they become magnetized.

A still further advantage of example embodiments is that the use of a digital processor to compare a quiescent flux profile against distorted flux profiles to sense DC currents reduces the number of required signal processing electronic components or devices, thereby improving the consistency, accuracy and reliability of the apparatus, while lowering component cost.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
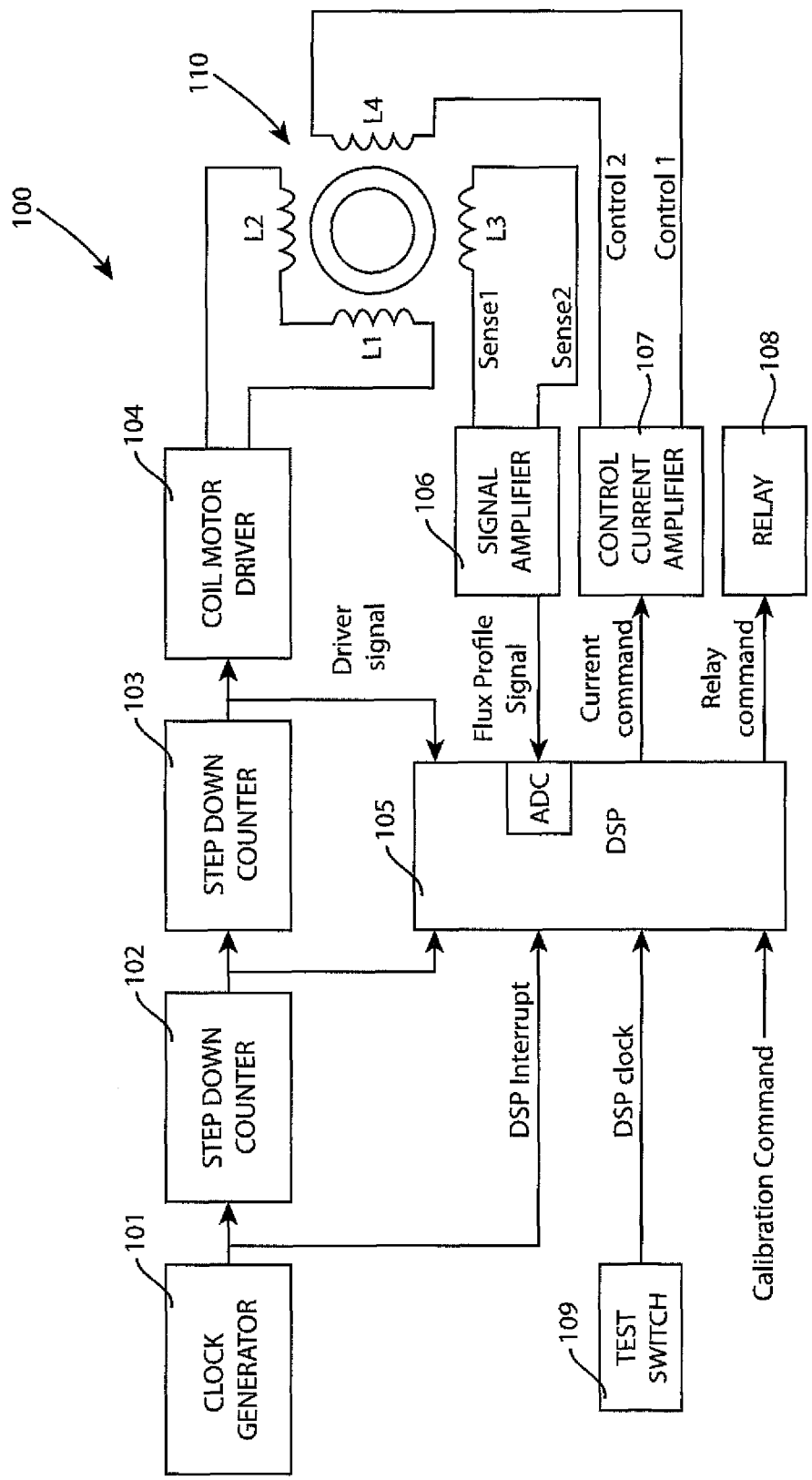
FIG. 1 is a block diagram of an example flux profile magnetometer.

FIG. 1 is block diagram, set forth by way of example and not limitation, of a flux profile magnetometer 100 for low current measurements. In this example, the flux profile magnetometer 100 includes a clock generator 101, a first step down counter 102, a second step down counter 103, a coil motor driver 104, a digital signal processor (DSP) 105, a signal amplifier 106, an optional control current amplifier 107, a relay 108, a test switch 109, and a dual core toroid 110.

The clock generator 101 is preferably a stable frequency oscillator device, e.g. a crystal oscillator. In one example, clock generator 101 can include a 16.384 MHz crystal oscillator that generates a rectangular pulse signal can be used as a DSP clock for DSP 105.

In this example embodiment, the first step down counter 102 scales down the DSP clock generated by the clock generator 101 to an appropriate frequency for the purpose of DSP 105 interrupt timing. For example, first step down counter 102 can reduce the DSP clock frequency to about 128 KHz to create a DSP Interrupt signal for the DSP 105 as a trigger to begin an Analog to Digital conversion (ADC) process. A second step down counter 103 further divides the DSP clock into a periodic AC driving signal so that the DSP ADC process can sample multiple times (e.g. 64 times) for each flux profile signal cycle.

Coil motor driver 104, in this non-limiting example, is responsive to the output of the second step down counter 103 and is operative to provide drive current for a winding L1 ("L1 coil") and a winding L2 ("L2 coil") of dual core toroid 110. Example DSP 105 has, as inputs, the DSP clock, the DSP interrupt, the periodic AC driving signal, and a flux profile signal developed by the signal amplifier 106. A suitable DSP can be obtained, by way of non-limiting example, from Microchip of Chandler, Ariz. The DSP 105, in this example, has a current command output coupled to the optional control current amplifier 107 and a relay command output coupled to a relay 108. The signal amplifier 106 has, as inputs, a winding L3 ("L3 coil") of dual core toroid 110 and an output of an analog flux profile signal which is converted to a digital flux profile signal in an ADC of DSP 105. The control current amplifier 107 has a current command input from the DSP 105, and a control-1 output and a control-2 output which are coupled to the ends of an optional N-turn winding L4 ("L4 coil") of the dual core toroid 110. Relay 108 has, as an input, a relay command signal generated by the DSP 105, and can be used for output switch, e.g. for a fault alarm. Optionally, the DSP 105 can also have a calibration command input and a test switch 109 input.

Figure 2:
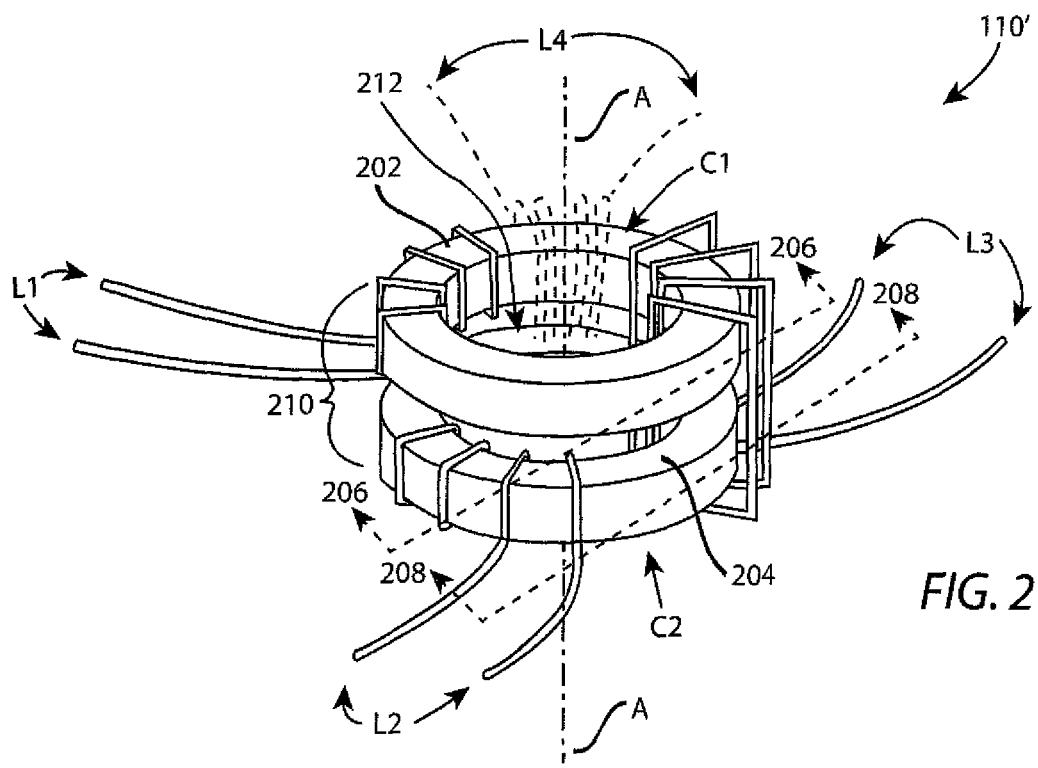
FIG. 2 is a perspective view of an example dual core toroid for the flux profile magnetometer of FIG. 1.

With reference to FIG. 2, an example dual core toroid 110 includes a first annular core C1 and a second annular core C2. The L1 coil is wound around annular core C1 and the L2 coil is wound around the annular core C2. In this embodiment, the number of turns of the L1 and L2 coils is preferably the same. The winding L3 is wound around both core C1 and core C2. Optional winding L4, which is also wound around both core C1 and C2, is shown in broken lines. In this embodiment, the annular cores are flat, circular rings having rectangular cross sections and aligned central axes A. Also in this embodiment, the magnetic properties of cores C1 and C2 are preferably the same, e.g. they are made from the same materials, have the same circumferences, have the same aperture sizes, have the same number of windings, etc.

The dual cores C1 and C2 are preferably made from highly magnetically permeable materials. By way of non-limiting example, cores from Magnetics, a division of Spang & Co., of Pittsburgh, Pa. using an 80% nickel-iron alloy (Ni Fe Mo) known as Supermalloy, and described as ½ SUPERMOL NON-METALLIC, part number 01500865F, have been found to be suitable. A first insulated wire L1 is wound around core C1 in a first direction and a second insulated wire L2 is wound around core C2 in a second direction. For example, first insulated wire can be wound in a clockwise spiral at least partially around a circumference 202 of core C1 and second insulated wire can be wound in a counterclockwise spiral at least partially around a circumference 204 of core. C2, or vice versa. After winding the C1 and C2 cores, they are aligned such that a first central axis of core C1 and a second central axis of core C2 are substantially coaxial with axis A, a first central plane 206 of core C1 and a second central plane 208 of core C2 are substantially parallel, and the first circumference 202 of core C1 and the second circumference 204 of core C2 define a combined circumference 210. By "substantially coaxial" and "substantially parallel" it is meant that cores C1 and C2 are aligned as closely as is practical, e.g. within a few degrees of being perfectly aligned. The cores C1 and C2 can then be affixed in position, e.g. with a suitable adhesive, before the third insulated wire coil L3, and optionally the fourth insulated wire coil L4, are wound at least partially around the combined circumference 210 of cores C1 and C2. The dual core toroid 110 can then be covered or protected, e.g. with tape or a thermal shrink-wrap cover.

In this example embodiment, the coil/motor driver 104 drives the L1 coil and L2 coil in series so that the current flow amplitude in both the L1 and L2 coils is the same but such that they produce flux flows in cores C1 and C2, respectively, that are equal but in opposite directions. Since the opposing flux flows in cores C1 and C2 are substantially the same, the L3 coil that winds around both cores will sense a net zero flux flow and, therefore, will not generate a signal until there is a sense current flowing through the aperture 212 of the dual cores. However, due to manufacturing and material variations, the magnetic properties of the L1 and L2 coils and the cores C1 and C2 are likely not to be exactly the same. It is therefore possible that a non-zero quiescent signal can be detected by the L3 coil. In example embodiments, the DSP can implement a process to calibrate the system to allow for variations of a quiescent flux signal due to these manufacturing and material variations.

Figure 3:
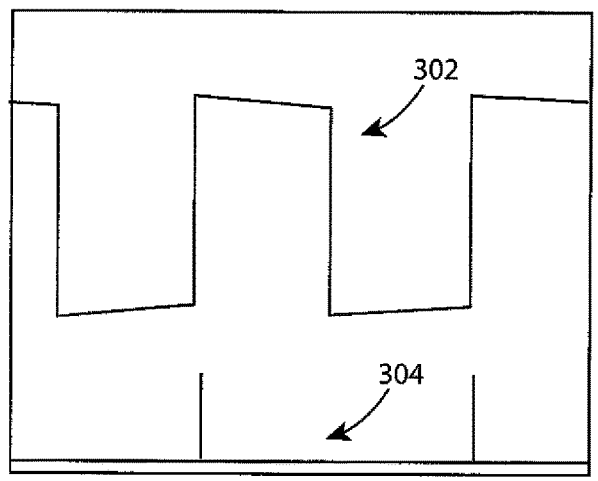
FIG. 3 is an illustration of an example waveform that can be applied to the dual core toroid of FIG. 2.

With reference to FIG. 3, the DSP 105 samples each flux profile signal cycle sixty-four times, in this non-limiting example. Also this example, the 128 KHz DSP interrupt is divided by 64 by step down counter 103 and then input into coil/motor driver 104 to develop 2 KHz rectangular timing cycle pulses ("periodic AC signals" or "square waves") 302 and into DSP 105 to generate index pulses 304 that index the beginning and end of each 2 KHz cycle by detecting the rising edge of the waveform. The square waves are used to drive the L1 and L2 coils.

Figure 4A:
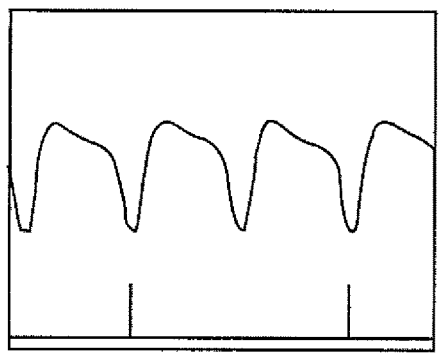
FIG. 4A is an illustration of a quiescent flux profile generated when the dual core toroid is positively biased.
Figure 5A:
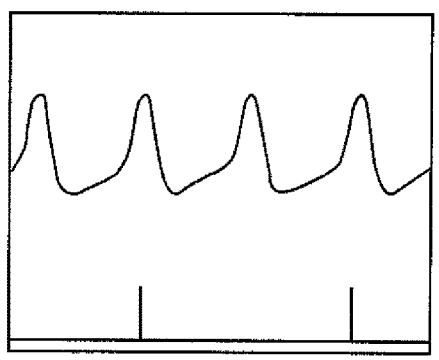
FIG. 5A is an illustration of a quiescent flux profile generated when the dual core toroid is negatively biased.
Figure 4B:
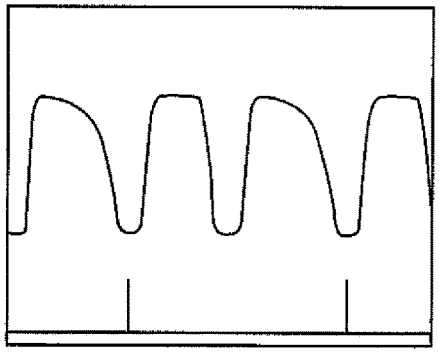
FIG. 4B is an illustration of a distortion of the flux profile when a positive sense current is applied to the positively biased dual core toroid.
Figure 5B:
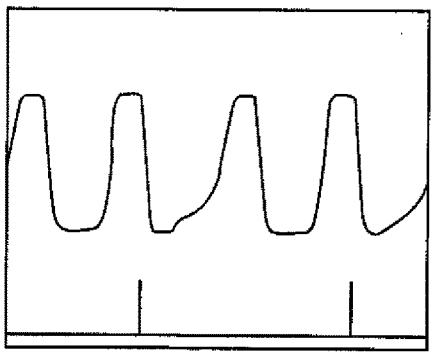
FIG. 5B is an illustration of a distortion of the flux profile when a negative sense current is applied to the negatively biased dual core toroid.

FIG. 4A is an illustration of a forward biased quiescent flux profile generated when the dual core toroid is positively (or "forward") biased. By "forward biased", it is meant that the annular cores C1 and C2 are biased to a positive side of the B-H curve for dual core toroid 110. FIG. 4B is an illustration of a distortion of the quiescent flux profile ("distorted flux profile") when a positive sense current is applied to the dual core toroid 110. FIG. 5A is an illustration of a reverse biased quiescent flux profile generated when the dual core toroid 110 is negatively (or "reverse") biased. By "reverse biased", it is meant that the annular cores C1 and C2 are biased to a negative side of the B-H curve for the dual core toroid 110. FIG. 5B is an illustration of a distorted flux profile when a negative sense current is applied to the dual core toroid 110. By using the quiescent flux profile as a baseline, processes implemented by, for example, DSP 105 calculates the sense current flowing through the dual core toroid 110 using the distorted flux profiles.

It should be noted that the processes described with respect to this example embodiment do not depend upon any particular shape of the flux profile but, instead, looks at the delta between a distorted flux profile and the quiescent flux ("base-line") profile. It should also be noted that the flux profile distortion can include a combination of amplitude and phase changes which can be analyzed by, for example, the DSP 105 to calculate the sense current.

Optional fourth L4 coil can serve several purposes. For example, an optional control current amplifier 107, under the control of DSP 105, can generate a control current through the cores that is of the same magnitude, yet opposite to, the sense current, thereby cancelling the effect of the sense current. From this, the DSP 105 can then precisely determine the direction and magnitude of the sense current. Also, the optional L4 coil can be used to degauss the cores C1 and C2 should they become magnetized by, for example, magnetic fields generated by large currents flowing through the cores. The degauss operation can be initiated at an opportune time as determined by the DSP 105, such that it does not interfere with the normal operation of the current sensing device. For example, when a sense current is below certain level, the DSP can initiate an attenuating, short duration degauss routine where a periodic alternating current is driven through the L4 by the control current amplifier 107.

Unlike prior art fluxgate apparatus, the alternating drive current does not drive the cores into magnetic saturation. Instead, the excitation windings are driven just enough to have flux flow in the cores. It is not necessary to keep or maintain the B-field in a particular domain. It is flexible enough to be able to operate without precision control of the B-field strength as long as the drive current is consistent. This has the advantage of saving power, energy consumption, and component cost saving.

It should also be noted that the example embodiments of the flux profile magnetometer 100 described above do not depend upon an absolute zero hysteresis magnetic core material in order to be able to detect positive or negative direction of the sense current through the cores. In other words, when the sense current biased the cores into the positive side or negative side of the B-H curve, the DSP 105 can differentiate which quiescent flux profile to use since the quiescent flux profile can be different when the cores are biased into positive or negative side of the B-H curve.

Since the sense current causes a flux flow change, a signal with a unique flux profile is generated at the sensing windings (e.g. the L3 coil). Under quiescent condition with no current flowing through the core apertures, the flux profile is captured and analyzed by the DSP 105 during initial factory calibration to be used as a reference or "base-line" profile. With current flowing through the apertures, the flux profile subtly changes shape from its base-line state. The DSP 105 use the change in flux profiles to equate to a real world current measurement through the aperture 212 of the cores C1 and C2. Also, the DSP 105 can differentiate the sense current bias hysteresis effect on the cores so that it can detect and measure either direction of the sense current under measurements with accuracy.

Figure 6:
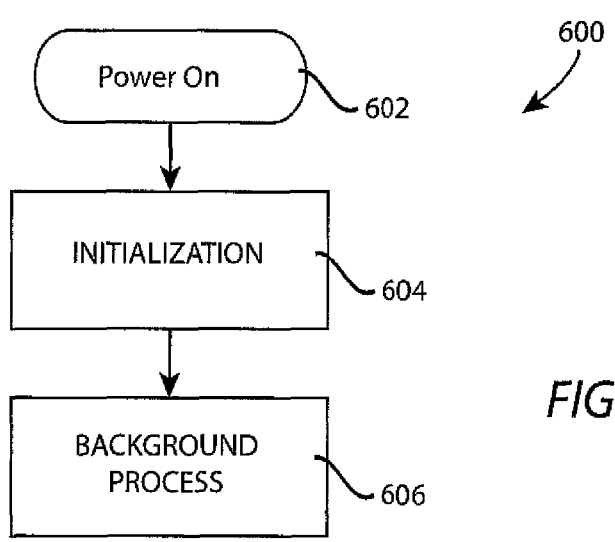
FIG. 6 is a block diagram of an example method for operating the flux profile magnetometer of FIG. 1.

FIG. 6 is a block diagram of an example system process 600 for operating the flux profile magnetometer of FIG. 1. In this process, an initialization process 604 is followed by a continuously running background process 606. The system process 600, in this non-limiting example, is implemented by the DSP 105. In other embodiments, the system process 600 can be implemented with other types of digital processors, such as a microprocessor, microcontroller, application specific integrated circuit (ASIC), etc. In most cases, the digital processor employed execute code segments stored in non-transitory digital media in order to implement system processes.

Figure 7:
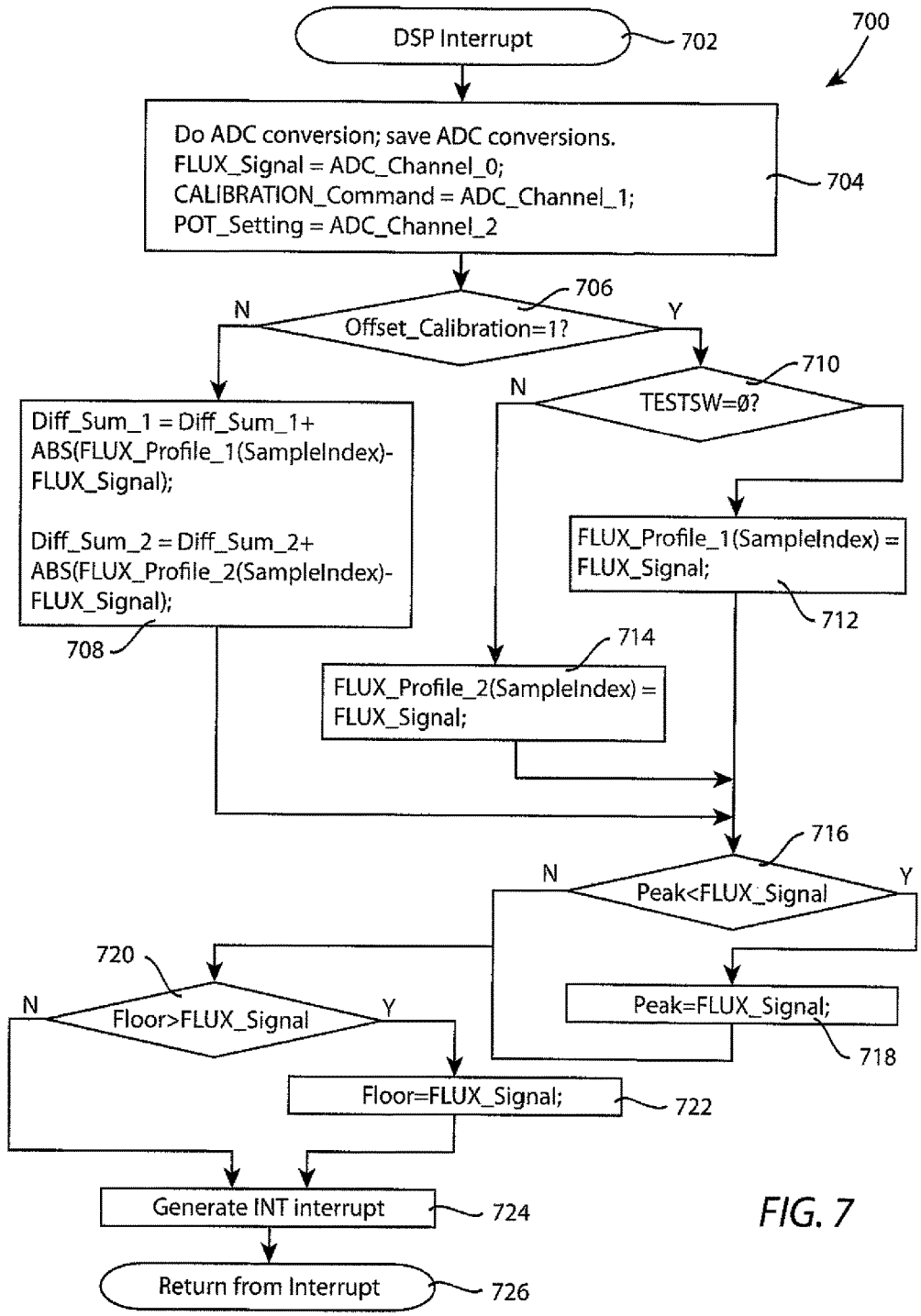
FIG. 7 is a flow diagram of an example DSP Interrupt process of the flux profile magnetometer of FIG. 1.

FIG. 7 is a flow diagram of an example DSP Interrupt process 700 of the flux profile magnetometer of FIG. 1. The DSP Interrupt process begins at 702 with, for example, an interrupt signal generated by the step down counter 102. Next, in an operation 704, the DSP 105 can perform ADC conversions of the flux profile signal provided by signal amplifier 106 as well as reading calibration command and pot setting values. Next, in an operation 706, it is determined whether an offset calibration is to be performed. If not, variables Diff_Sum_1 and Diff_Sum_2 are set in an operation 708. If an offset calibration is to be performed, an operation 710 determines if the test switch is off (TESTSW=0) and, if so, an operation 712 sets the array variable FLUX_Profile_1(SampleIndex) equal to the flux signal value. If not, an operation 714 sets the array variable FLUX_Profile_2(SampleIndex) to the flux signal value. It should be noted that operations 710-714 are generally only performed at the factory. After the completion of operations 708, 712 or 714, an operation 716 determines whether the variable PEAK is less than that of the flux signal FLUX_Signal. If so, the variable PEAK is set to the value of FLUX_Signal in an operation 718. Next, in an operation 720, it is determined whether the variable Floor is greater than FLUX_Signal and, if so, the variable Floor is set to the value of FLUX_Signal in an operation 722. The effect of operations 716-722 is to capture the peak and floor of the flux signal. Next, an operation 724 generates an INT interrupt, which is a lower level interrupt than the DSP interrupt, from which the process 700 returns in an operation 726 to the background process 606. Therefore, in this example process, there are three levels of computational priority, namely the background process 606 as the base, the INT interrupt called by the process 700, and the DSP interrupt created by the clock generator 101.

Figure 8:
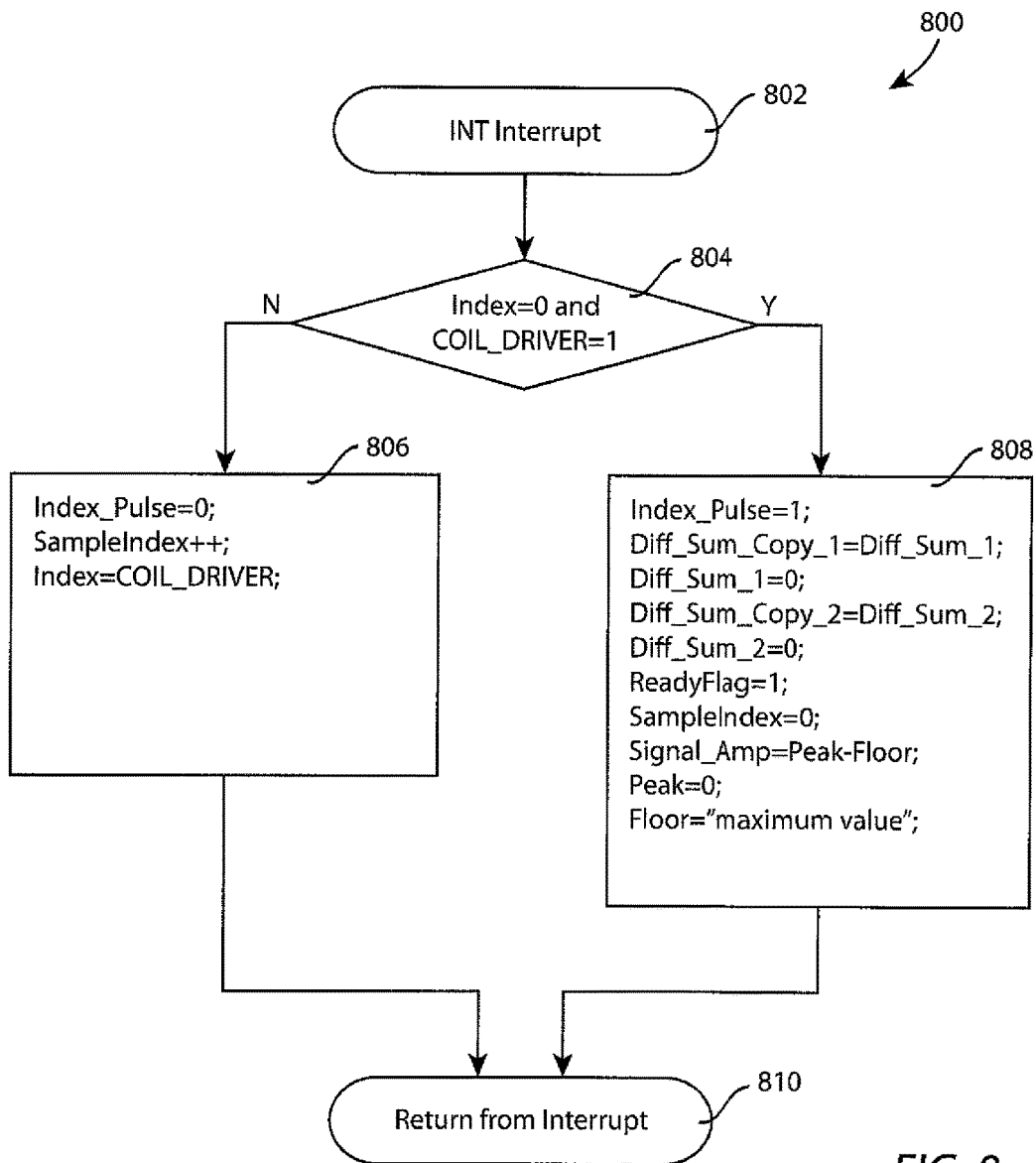
FIG. 8 is a flow diagram of an example INT Interrupt process of the flux profile magnetometer of FIG. 1.

FIG. 8 is a flow diagram of an example INT Interrupt process 800 of the flux profile magnetometer of FIG. 1. The INT interrupt process 800 begins at 802 upon the generation of an INT interrupt by, for example, operation 724 of FIG. 7. In this example, if it is not the case that the variable Index is 0 and the variable COIL_DRIVER is 1 as determined by an operation 804, the variable Index_Pulse is set to 0, the variable SampleIndex is incremented, and the variable Index is set to the value of COIL_DRIVER in an operation 806. If operation 804 determines that the variable Index is 0 and the variable COIL_DRIVER is 1 (e.g. a rising edge is detected in FIG. 3), the variable Index_Pulse is set to 1 and a number of parameters are initialized in an operation 808, which is used to capture the calculations between the rising edges of FIG. 3 for subsequent processing by the background process 606. After the completion of operation 806 or 808, the process 800 returns from the INT Interrupt in an operation 810.

Figure 9:
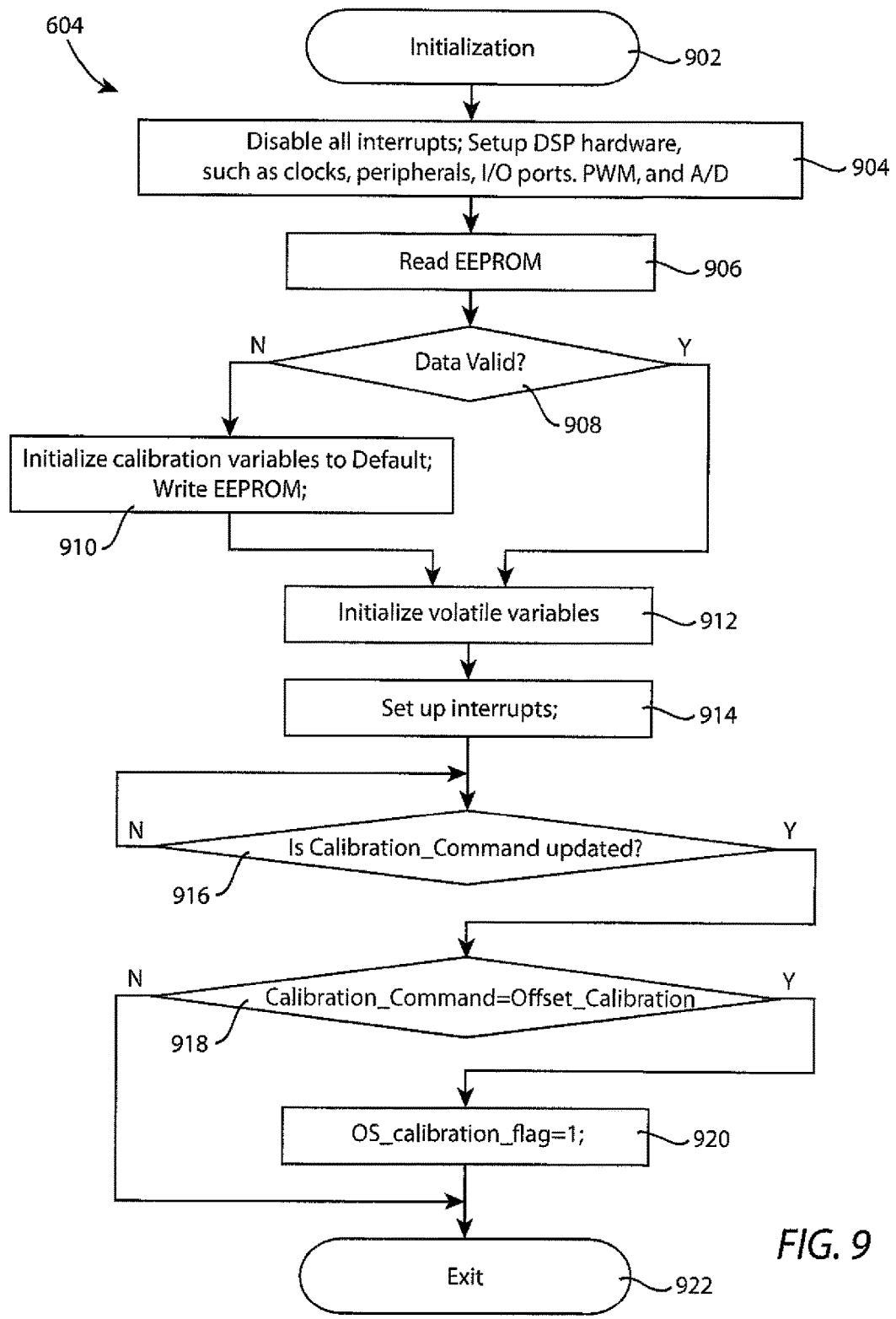
FIG. 9 is a flow diagram of an example Initialization process of FIG. 6.

FIG. 9 is a flow diagram of an example Initialization process 604 of FIG. 6. The Initialization process 902 begins with operation 902 and, in an operation 904, all interrupts are disabled and hardware of the DSP 105 is set up (e.g. clocks, peripherals, I/O ports, pulse-width-modulation (PWM), ADC, etc.). Next, non-volatile memory, such as an electrically erasable, programmable, read-only memory (EEPROM), typically internal to the DSP 105, is read in an operation 906 and validated in an operation 908. If the data read from the EEPROM is not valid, an operation 910 initializes calibration variable to a default value, which are then written back to the EEPROM. Next, volatile variables are initialized in an operation 912, interrupts are set up in an operation 914 and an operation 916 determines if the variable Calibration_Command has been updated. If not, operation 916 idles until it is determined that the Calibration_Command variable has been updated. Next, in an operation 918, it is determined whether Calibration_Command is equal to the variable Offset_Calibration and, if it is, an operation 920 sets a flag OS_calibration_flag to 1. The process 604 ends with the exit operation 922.

Figure 10:
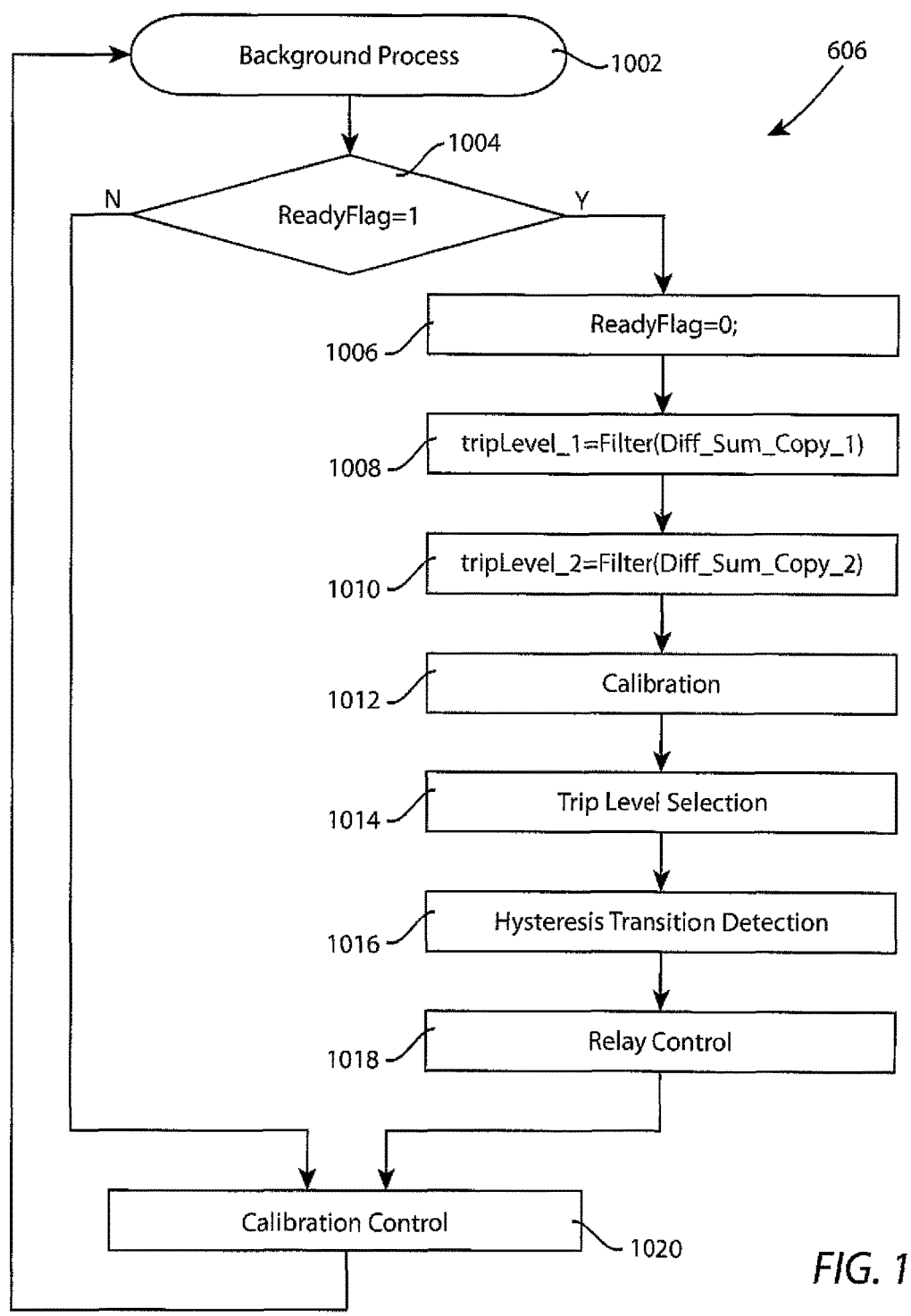
FIG. 10 is a flow diagram of an example Background process of FIG. 6.

FIG. 10 is a flow diagram of an example Background process 606 of FIG. 6, which begins at 1002. Next, an operation 1004 determines if a flag ReadyFlag is equal to 1. If so, operation 1006 sets ReadyFlag to 0 and the variables tripLevel_1 and tripLevel_2 are set by operations 1008 and 1010, respectively. Operations 1008 and 1010 call a subroutine Filter, the operation of which will be discussed in greater detail with reference to FIG. 11. Next, the Calibration operation 1012, Trip Level Selection operation 1014, Hysteresis Transition Detection 1016 and Relay Control 1018 are performed. Finally, a Calibration Control operation 1020 is performed before looping the Background Process 606 to its beginning at operation 1002.

Figure 11:
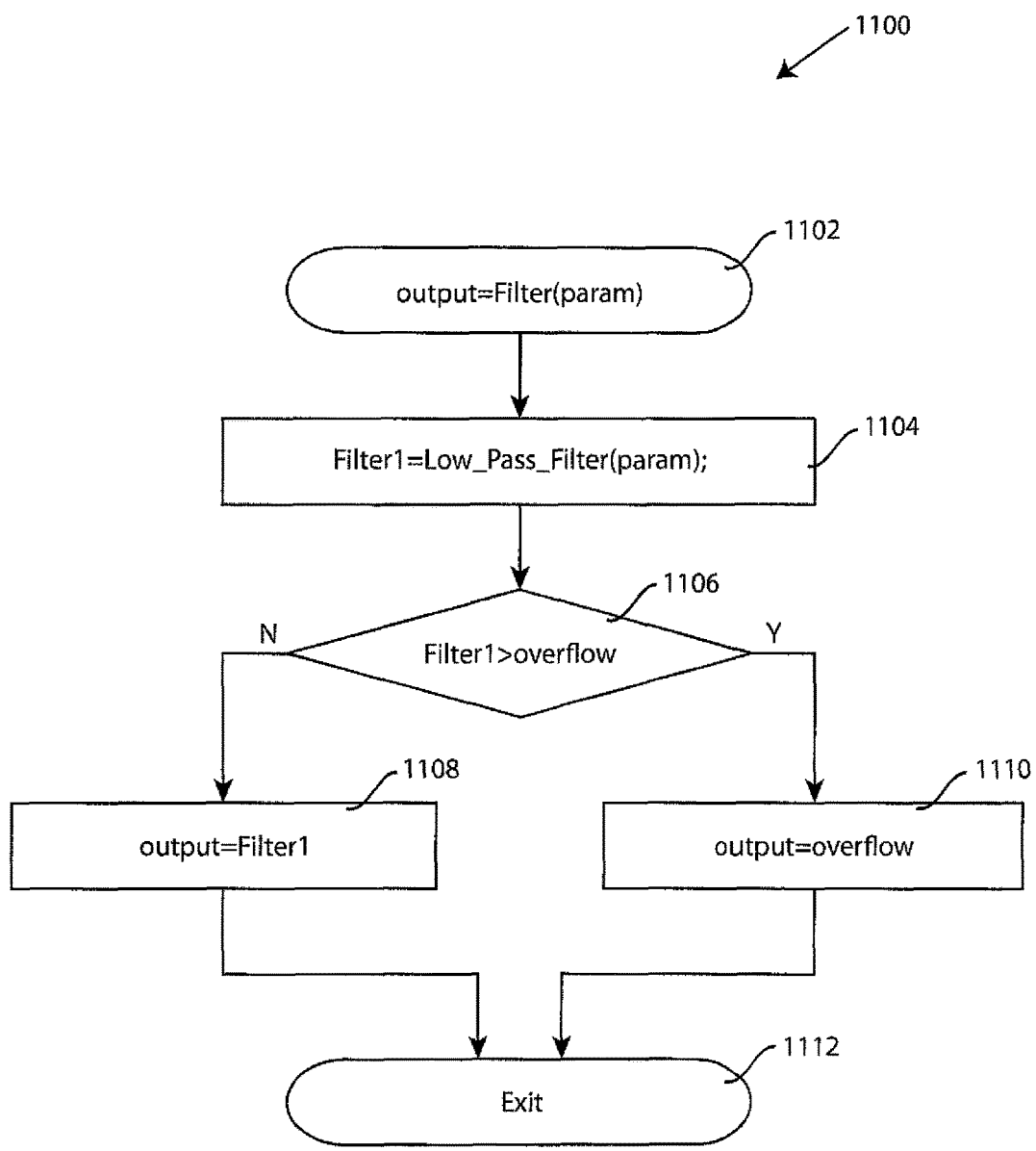
FIG. 11 is a flow diagram of an example output filtering subroutine.

FIG. 11 is a flow diagram of an example output filtering ("Filter") subroutine 1100 that can be called, for example, by operations 1008 or 1010 of FIG. 10. Subroutine 1100 begins at 1102 setting the variable "output" to Filter(param) and, in an operation 1104, the variable Filter1 is set to Low_Pass_Filter(param). Next, an operation 1106 determines if Filter1 is greater than the constant "overflow" and, if not, the variable output is set to Filter1. If Filter 1 is greater than the constant overflow, an operation 1110 sets the variable output to the constant overflow. Process 1100 is then complete and returns with an exit operation 1112.

Figure 12:
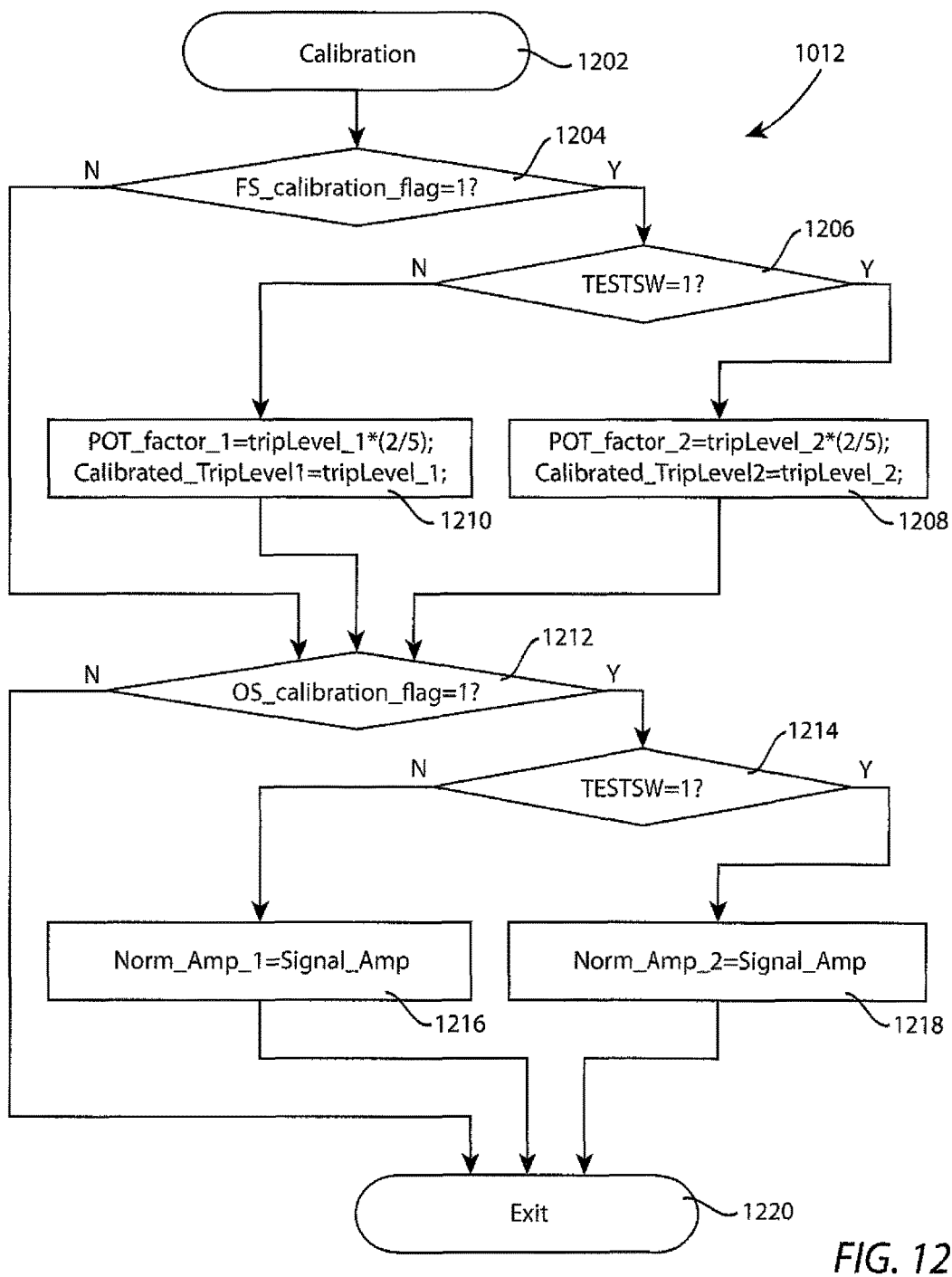
FIG. 12 is a flow diagram of an example Calibration process of FIG. 10.

FIG. 12 is a flow diagram of an example Calibration process of 1012 of FIG. 10 which begins at operation 1202. Next, the flag FS_calibration_flag is read and, if it is set to 1, a flag TESTW is read in an operation 1206. If TESTW is set to 1, an operation 1208 sets variables POT_factor_2 and Calibrated_TripLevel2, and if TESTW is not set to 1, an operation 1210 sets variables POT_factor_1 and Calibrated_TripLevel1. Next, in an operation 1212, a flag OS_calibration_flag is read, and if it is set to 1, and operation 1214 reads the flag TESTW. If TESTW is not set to 1, a variable Norm_Amp_1 is set to the value Signal_Amp in an operation 1216 and, if TESTW is set to 1, a variable Norm_Amp_2 is set to Signal_Amp. Process 1012 is then completed with the exit operation 1220. It should be noted that the Calibration process 1012 typically occurs at the factory, and that the FS_calibration_flag of operation 1204 and the OS_calibration_flag of operation 1212 are typically never set to "1" in the field.

Figure 13:
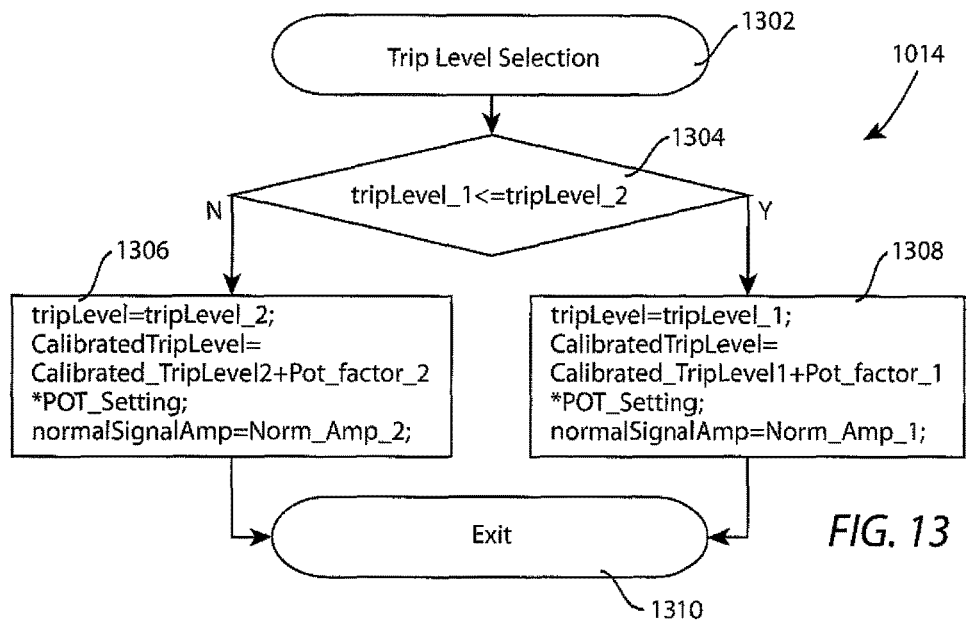
FIG. 13 is a flow diagram of an example Trip Level Selection process of FIG. 10.

FIG. 13 is a flow diagram of an example Trip Level Selection process 1014 of FIG. 10. Process 1014 begins at 1302 and, in an operation 1304, it is determined if the variable tripLevel_1 is less than or equal to tripLevel_2. If not, the variable tripLevel is set to tripLevel_2, and the variable CalibratedTripLevel is adjusted accordingly, in an operation 1306 and, if so, in an operation 1308 the variable tripLevel is set to tripLevel_1 and the variable CalibratedTripLevel is adjusted accordingly. The process 1014 is then completed with the exit operation 1310. In this example, the operation 1304 checks for the amount of deviation between quiescent and distorted flux profiles, e.g. deviations between the flux profiles depicted in FIGS. 4A and 4B and deviations between the flux profiles depicted in FIGS. 5A and 5B.

Figure 14:
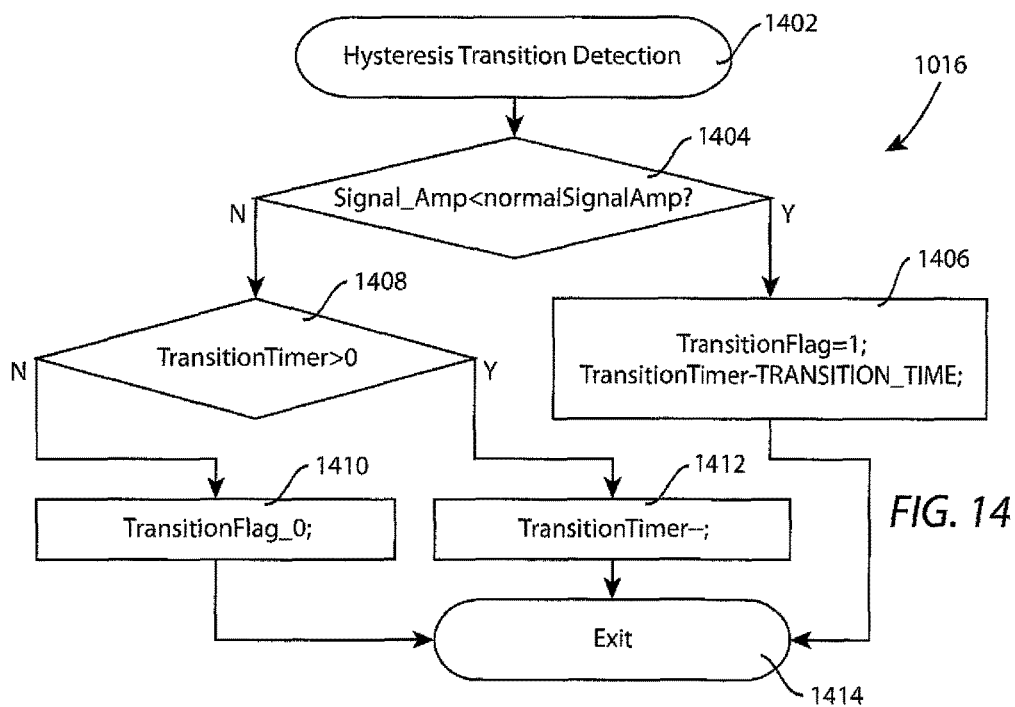
FIG. 14 is a flow diagram of an example Hysteresis Transition Detection process of FIG. 10.

FIG. 14 is a flow diagram of an example Hysteresis Transition Detection process 1016 of FIG. 10. Process 1016 begins at 1402 and, in an operation 1404, it is determined if the variable Signal_Amp is less than a constant normalSignalAmp. If it is, an operation 1406 sets a variable TransitionFlag to 1, and sets the variable Transition Timer to TRANSITION_TIME. If operation 1404 determines that Signal_Amp is not less than normalSignalAmp, an operation 1408 determines if the variable TransitionTime is greater than 0. If not, the variable TransitionFlag is set to zero in an operation 1410 and, if so, the variable TransitionTimer is decremented by one. After the completion of operations 1406, 1410 or 1412 the process 1016 is completed with an exit operation 1414. In this example process, flux profile transitions are detected, e.g. transitions from the flux profile of FIG. 4A to the flux profile of FIG. 5A, and vice versa. During such transitions, trips are suppressed in this example embodiment.

It should be noted that the role of hysteresis bias comes into play if the sense current, e.g. the current flowing in a wire through the dual core toroid 110, changes in direction. That is, a sense current running in a first direction ("a first polarity") will bias the dual core toroid in a first direction such that when the sense current reverses ("switches") to run in a second direction ("a second polarity") the sensed magnetic field is reduced. This is not a significant issue when the sense current is relatively large, but can become a significant issue with smaller sense currents. For example, if a sense current of 5 mA flows through the dual core toroid 110 in a first direction, and then reverses to flow in a second direction, the L3 coil may only see a net magnetic field equivalent to a 3 mA sense current due to hysteresis bias.

In an example embodiment, a hysteresis bias of the dual core toroid 110 is determined. For example, hysteresis bias value can be determined during a calibration process, or can be determined during operation. The hysteresis bias value can then be used to compensate for the hysteresis bias of the dual core toroid 110 when, for example, determining the amplitude of the sense current. Alternatively, a transition effect determination of the dual core toroid 110 when the sense current switches polarity can be used to compensate for transition-based effects on the measure sense current. These processes can be embodied in code segments stored in non-transitory digital readable media for execution by a digital processor.

As noted above, an apparatus for sensing D.C. currents can include code segments executable by the digital processor, such as DSP 105, for determining a hysteresis bias of the dual core toroid. In an example embodiment, this can be accomplished during factory calibration and can form a part of the data derived for the forward biased and reverse biased quiescent flux profiles and amplitudes. By way of non-limiting example, hysteresis bias information can be stored in a lookup table along with the forward biased and reverse biased quiescent flux profiles and amplitudes.

Apparatus 100 can also include code segments executable by the DSP 105 to compensate for hysteresis bias of the dual core toroid when determining the amplitude of the sense current. For example, the DSP 105 can determine which flux profile to use by comparing profile deviations, e.g. in operation 1014 of FIGS. 10 and 13.

Still further, apparatus can also include code segments executable by the DSP 105 to compensate for detected transition effects of the dual core toroid when the sense current switches polarity. A transition effect may be detected, for example, by comparing the detected profile amplitude with the factory stored profile amplitudes of both the forward biased and reverse biased quiescent profiles. In FIG. 9, for example, operation 906 of the initialization process 604 reads an EEPROM of the DSP 105 and, if the data is not valid, an operation 910 writes to the EEPROM valid data for FLUX_Profile_1, FLUXProfile_2, Calibrated_TripLevel1, Calibrated_TripLevel2, Norm_Amp_1, Norm_Amp_2, Pot_Factor_1, and Pot_Factor_2. A result of the initialization process 604 is, therefore, data stored in the EEPROM including data concerning two flux profiles, two flux profile amplitudes, two calibrated trip levels, and two pot factors. During the background operation 606 of FIGS. 6 and 10, hysteresis transitions can be detected by operation 1016 (see FIGS. 10 and 14) using measured data and the data stored in the EEPROM of the DSP 105.

By way of further explanation of the transition effect, when a sense current switches from positive to negative, or vice versa, the detected flux profile will switch from forward to reverse, or vice versa. During the switch, the detected flux profile can be considered to be "invalid", e.g. distorted or subject to error, until after the sense current crosses "zero" and then increases from "zero" to a certain amplitude. During the transition from "zero" to the opposite value of the sense current, its former flux profile amplitude decreases and then the new flux profile amplitude increases. This "flip over" effect typically requires only a small amount of sense current for a short period of time such that the transition region, while unstable, is quite narrow. This effect can be visualized as pushing a ball down a "W" shaped structure, where the ball will settle into one of the two troughs of the W but is unstable at the central transition peak.

Figure 15:
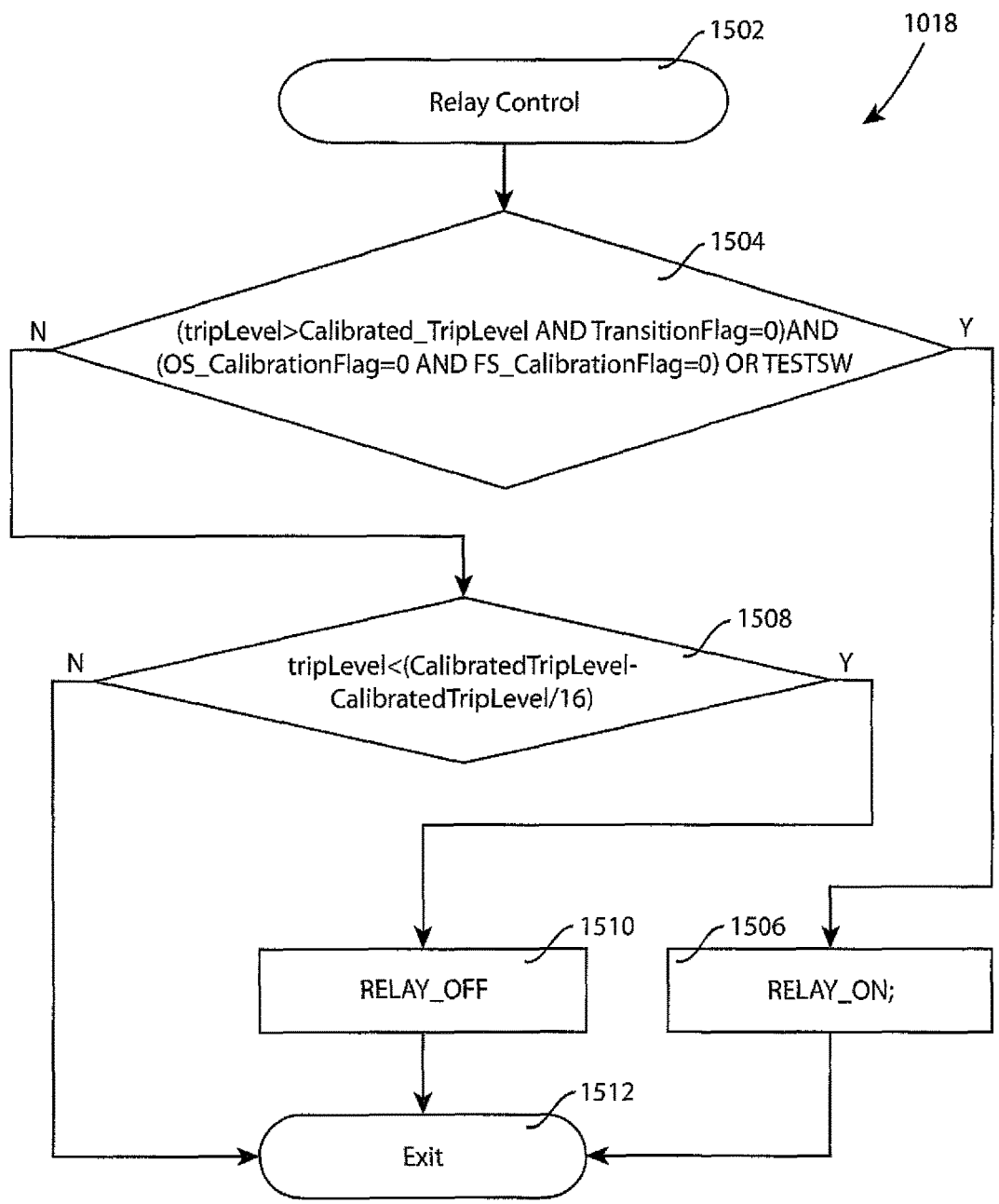
FIG. 15 is a flow diagram of an example Relay Control process of FIG. 10.

FIG. 15 is a flow diagram of an example Relay Control process 1018 of FIG. 10. Relay Control process 1018 begins at 1502 and, in an operation 1504, it is determined whether the relay should be turned on by an operation 1506. The decision operation 1504 will cause the relay to be turned on if the test switch (TESTSW) is activated or if a number of conditions and flags are true. If operation 1504 determines that the relay is not to be turned on, an operation 1508 determines whether the relay should be turned off in an operation 1510. Therefore, decision operation 1508 is an additional test to determine if the relay is already on. If not, or after the completion of operation 1506 or 1510, the process 1018 is completed and exit process 1512 is executed.

Figure 16:
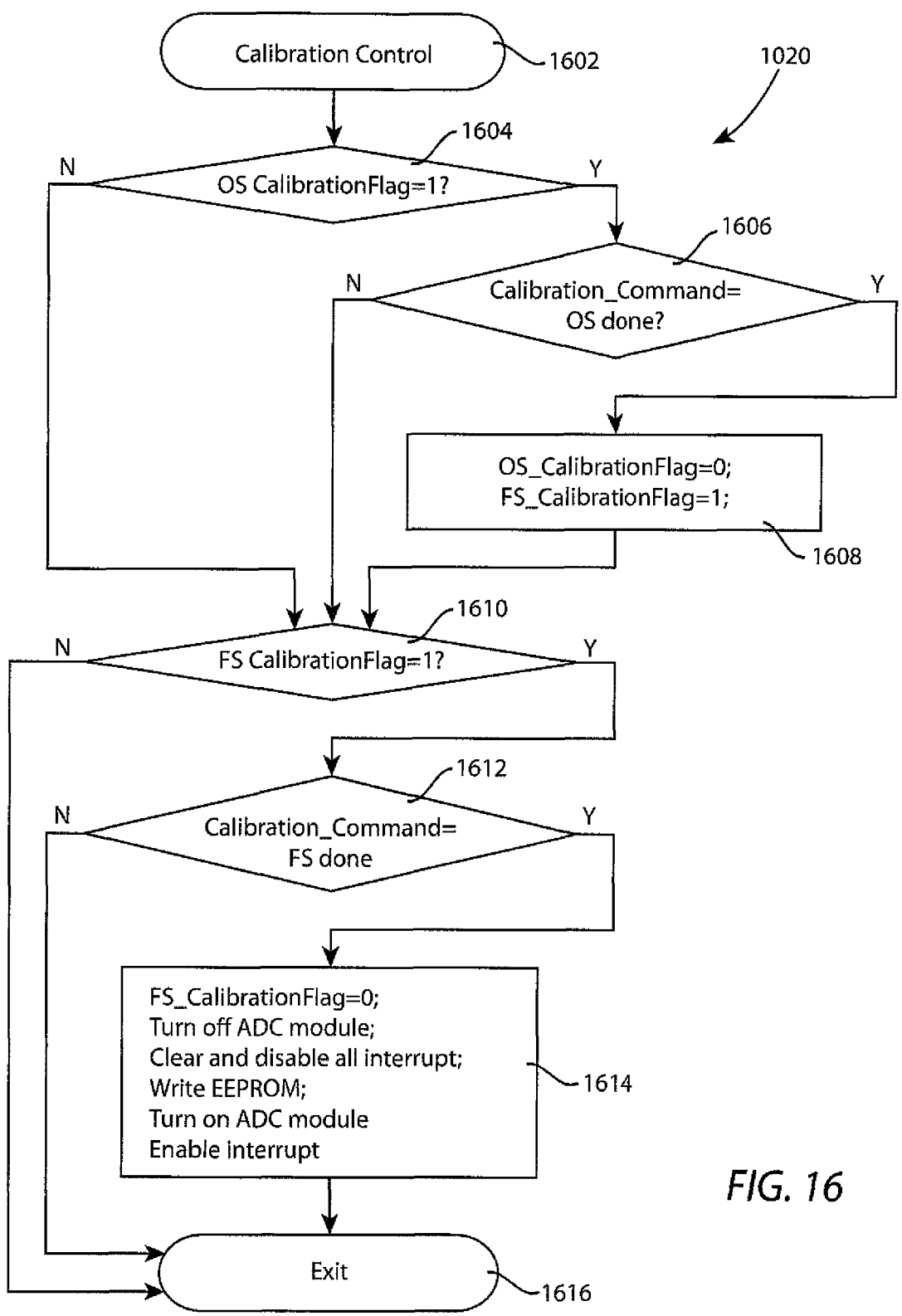
FIG. 16 is a flow diagram of an example Calibration Control process of FIG. 10.

FIG. 16 is a flow diagram of an example Calibration Control process 1020 of FIG. 10 which begins at 1602 and, in an operation 1604, it is determined whether the OS Calibration Flag has been set (e.g. is equal to "1"). If so, an operation 1606 determines whether Calibration Command is "OS done" and, if so the OS Calibration Flag is set to zero and the FS Calibration Flag is set to one. Next, in an operation 1610, it is determined whether the FS Calibration Flag has been set (e.g. is equal to "1"). If yes, a decision operation 1612 determines whether the Calibration Command is "FS done". If so, an operation 1614 sets the FS Calibration flag to zero, turns off the ADC module, clears and disable all interrupts, writes to memory (e.g. EEPROM), turns the ADC module back on, and re-enables the interrupts. The Calibration Control process 1020 then exits at 1616.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. An apparatus for sensing D.C. currents comprising:
a dual core toroid including a first core defining a first circumference, a first central axis and a first central plane perpendicular to the first central axis, the first core being at least partially wound with a first insulated wire, a second core defining a second circumference, a second central axis and a second central plane perpendicular to the second central axis, wherein the first core and the second core are aligned such that the first central axis and the second central axis are substantially coaxial, the first central plane and the second central plane are substantially parallel and the first circumference and the second circumference define a combined circumference, the second core being at least partially wound with a second insulated wire, and a third insulated wire wound at least partially around the combined circumference of the first core and the second core, wherein the first insulated wire is wound around the first core in a first direction and the second insulated wire is wound around the second core in a second direction and is connected in series with the first insulated wire such that magnetic fluxes in the first core and the second core flow in opposite directions;
a coil motor driver developing rectangular pulses coupled to the series connection of the first insulated wire and the second insulated wire;
a signal amplifier having an input coupled to the third insulated wire and operative to develop an analog flux profile signal;
an analog-to-digital (A/D) converter coupled to an output of the signal amplifier and operative to develop a digital flux profile signal; and
a digital processor coupled to the A/D converter and to a non-transitory memory including code segments executable by the digital processor to calculate a sense current flow from variations between a quiescent digital flux profile and a distorted digital flux profile.

2. An apparatus for sensing D.C. currents comprising:
a dual core toroid including a first core at least partially wound with a first insulated wire, a second core at least partially wound with a second insulated wire, and a third insulated wire wound at least partially around a combination of the first core and the second core, wherein the first insulated wire and the second insulated wire are connected in series such that magnetic fluxes in the first core and the second core flow in opposite directions, and wherein the first insulated wire is wound around the first core in a first direction and wherein the second insulated wire is wound around the second core in a second direction;
a coil motor driver developing rectangular pulses coupled to the series connection of the first insulated wire and the second insulated wire;
a signal amplifier having an input coupled to the third insulated wire and operative to develop an analog flux profile signal;
an analog-to-digital (A/D) converter coupled to an output of the signal amplifier and operative to develop a digital flux profile signal;
a digital processor coupled to the A/D converter to calculate a sense current flow from variations between a quiescent digital flux profile and a distorted digital flux profile; and
a fourth insulated wire wound around the combination of the first core and the second core and coupled to an output of a current control amplifier, the current control amplifier having a current command input coupled to the digital processor.

3. An apparatus for sensing D.C. currents comprising:
a dual core toroid including a first core at least partially wound with a first insulated wire a second core at least partially wound with a second insulated wire, and a third insulated wire wound at least partially around a combination of the first core and the second core, wherein the first insulated wire and the second insulated wire are connected in series such that magnetic fluxes in the first core and the second core flow in opposite directions, and wherein the first insulated wire is wound around the first core in a first direction and wherein the second insulated wire is wound around the second core in a second direction;
a coil motor driver developing rectangular pulses coupled to the series connection of the first insulated wire and the second insulated wire;
a signal amplifier having an input coupled to the third insulated wire and operative to develop an analog flux profile signal;
an analog-to-digital (A/D) converter coupled to an output of the signal amplifier and operative to develop a digital flux profile signal;

a digital processor coupled to the A/D converter to calculate a sense current flow from variations between a quiescent digital flux profile and a distorted digital flux profile;

a clock generator having a DSP clock output coupled to the digital processor; and a first step down counter having an input coupled to the DSP clock output and having a DSP interrupt output coupled to the digital processor.

4. An apparatus for sensing D.C. currents as recited in claim 3 further comprising a second step down counter having an input coupled to the DSP interrupt and having a periodic AC driving signal output coupled to the digital processor and to the coil motor driver.

5. An apparatus for sensing D.C. currents as recited in claim 3 further comprising a fourth insulated wire wound around the combination of the first core and the second core and coupled to an output of a current control amplifier, the current control amplifier having a current command input coupled to the digital processor.

6. An apparatus for sensing D.C. currents as recited in claim 3 further comprising non-transitory memory including code segments executable by the digital processor for:
  (a) developing a quiescent flux profile from an output of the dual core toroid when no sense current is flowing thorough the dual core toroid;
  (b) storing the quiescent flux profile;
  (c) developing a distorted flux profile from the output of the dual core toroid when a sense current is flowing through the dual core toroid; and
  (d) processing variances between the stored quiescent flux profile and the distorted flux profile to determine at least one characteristic of the sense current including an amplitude of the sense current and a polarity of the sense current.

7. An apparatus for sensing D.C. currents as recited in claim 6 wherein the stored quiescent flux profile is a first stored quiescent flux profile of at least one of a first polarity and a first amplitude, and further comprising detecting, digitizing and storing a second quiescent flux profile of at least one of a second polarity and a second amplitude.

8. An apparatus for sensing D.C. currents as recited in claim 6 further comprising code segments executable by the digital processor for determining a hysteresis bias of the dual core toroid.

9. An apparatus for sensing D.C. currents as recited in claim 8 further comprising code segments executable by the digital processor for compensating for the hysteresis bias of the dual core toroid when determining the amplitude of the sense current.

10. An apparatus for sensing D.C. currents as recited in claim 6 further comprising code segments executable by the digital processor to compensate for a detected transition effect of the dual core toroid when the sense current switches polarity.

11. A method for sensing D.C. currents comprising:
  (a) detecting with a digital processor executing code segments stored in non-transitory memory of a flux profile magnetometer an analog quiescent flux profile from an output of a dual core toroid of the flux profile magnetometer when no sense current is flowing thorough the dual core toroid;
  (b) digitizing the analog quiescent flux profile with the digital processor to create a digital quiescent flux profile;
  (c) storing the digital quiescent flux profile in non-transitory computer readable media of the flux profile magnetometer;
  (d) detecting with the digital processor a distorted flux profile from the output of the dual core toroid when a sense current is flowing through the dual core toroid;
  (e) digitizing the distorted flux profile with the digital processor to create a digital distorted flux profile; and
  (f) using the digital processor to determine at least one characteristic of the sense current from a comparison between the stored digital quiescent flux profile and the distorted flux profile.

12. A method for sensing D.C. currents as recited in claim 11 wherein the stored quiescent flux profile is a first stored quiescent flux profile of a first polarity and further comprising detecting, digitizing and storing a second quiescent flux profile of a second polarity.

13. A method for sensing D.C. currents as recited in claim 11 wherein the stored quiescent flux profile is a first stored quiescent flux profile of a first amplitude and further comprising detecting, digitizing and storing a second quiescent flux profile of a second amplitude.

14. A method for sensing D.C. currents as recited in claim 11 wherein the at least one characteristic of the sense current is an amplitude of the sense current.

15. A method for sensing D.C. currents as recited in claim 11 wherein the at least one characteristic of the sense current is a polarity of the sense current.

16. A method for sensing D.C. currents as recited in claim 11 further comprising repeating operations (d)-(f).

17. A device for sensing D.C. currents comprising:
  a first magnetically permeable annular core defining a first circumference, a first central axis and a first central plane perpendicular to the first central axis;
  a second magnetically permeable annular core defining a second circumference, a second central axis and a second central plane perpendicular to the second central axis, wherein the first magnetically permeable annular core and the second magnetically permeable annular core are aligned such that the first central axis and the second central axis are substantially coaxial, the first central plane and the second central plane are substantially parallel and the first circumference and the second circumference define a combined circumference;
  a first insulated wire coil wound in a first direction at least partially around the first circumference of the first magnetically permeable annular core;
  a second insulated wire coil wound in a second direction at least partially around the second circumference of the second magnetically permeable annular core, where the first insulated wire coil and the second insulated wire coil are connected in series, have the same number of turns, and configured such that a magnetic flux flows in the first magnetically permeable annular core in a first direction and that a magnetic flux flows in the second magnetically permeable annular core is in a second direction opposite to the first direction when a current is caused to flow through the series connection of the first insulated wire coil and the second insulated wire coil; and
  a third insulated wire coil wound at least partially around the combined circumference of the first magnetically permeable annular core and the second magnetically permeable annular core;

wherein the first magnetically permeable annular core and the second magnetically permeable magnetic core are affixed together with an adhesive.

18. A dual core toroid for sensing D.C. currents as recited in claim 17 further comprising a fourth insulated wire coil wound at least partially around the combined circumference of the first magnetically permeable annular core and the second magnetically permeable annular core.

19. A dual core toroid for sensing D.C. currents as recited in claim 18 further comprising a coil motor driver coupled to the series connection of the first insulated wire coil and the second insulated wire coil, and a signal amplifier coupled to the third insulated wire coil.

\* \* \* \* \*